(12) United States Patent
Watanabe

(10) Patent No.: US 8,896,376 B2
(45) Date of Patent: Nov. 25, 2014

(54) DIGITAL AMPLIFIER

(75) Inventor: Shinichi Watanabe, Kanagawa (JP)

(73) Assignee: Panasonic Corporation, Osaka (JP)

( * ) Notice: Subject to any disclaimer, the term of this patent is extended or adjusted under 35 U.S.C. 154(b) by 293 days.

(21) Appl. No.: 13/634,632

(22) PCT Filed: Mar. 25, 2011

(86) PCT No.: PCT/JP2011/001756
§ 371 (c)(1),
(2), (4) Date: Sep. 13, 2012

(87) PCT Pub. No.: WO2011/121954
PCT Pub. Date: Oct. 6, 2011

(65) Prior Publication Data
US 2013/0003994 A1    Jan. 3, 2013

(30) Foreign Application Priority Data

Mar. 31, 2010  (JP) ................................. 2010-083295

(51) Int. Cl.
*H03F 3/217* (2006.01)
*H03F 1/32* (2006.01)
(52) U.S. Cl.
CPC . *H03F 3/217* (2013.01); *H03F 1/32* (2013.01)
USPC .......................... 330/251; 330/10; 330/207 A
(58) Field of Classification Search
USPC .......................... 330/251, 10, 207 A; 381/120
See application file for complete search history.

(56) References Cited

U.S. PATENT DOCUMENTS

| 6,696,891 B2 | 2/2004 | Noro et al. |
| 6,768,779 B1 | 7/2004 | Nielsen |
| 8,203,382 B2 * | 6/2012 | Maeda .......................... 330/251 |
| 2003/0058038 A1 | 3/2003 | Noro et al. |
| 2005/0253649 A1 | 11/2005 | Morishima |
| 2007/0247223 A1 | 10/2007 | Morishima |

FOREIGN PATENT DOCUMENTS

| JP | 2001-517393 | 10/2001 |
| JP | 2003-101357 | 4/2003 |
| JP | 2005-341550 | 12/2005 |
| JP | 2006-115028 | 4/2006 |
| JP | 2009-100352 | 5/2009 |
| WO | 2007/011012 | 1/2007 |

OTHER PUBLICATIONS

International Search Report, mailed May 31, 2011, for corresponding International Application PCT/JP2011/001756.

* cited by examiner

*Primary Examiner* — Hieu Nguyen
(74) *Attorney, Agent, or Firm* — Greenblum & Bernstein, P.L.C.

(57) ABSTRACT

The disclosed digital amplifier (200) is provided with a voltage value conversion block (220) for converting a digital value of a digital pulse width of a digital modulation block (210) to a voltage value; and an integration circuit block (230) for generating a triangular wave by way of a master clock and modulating the generated triangular wave on the basis of a signal corresponding to the value of the modulation width of digital pulse width modulation. The disclosed digital amplifier (200) is provided with a low-pass filter (260) for demodulating pulse power that has been power-amplified by way of a drive circuit (250) to analog power of an audio band, and an error amplifier (290) for computing the voltage difference between the voltage of a low-pass filter (280) and the low-pass filter (260) and amplifying thereof.

5 Claims, 19 Drawing Sheets

DIGITAL AMPLIFIER

TECHNICAL FIELD

The present invention relates to a digital amplifier of an audio device.

BACKGROUND ART

A class D amplifier enables extremely good power conversion efficiency to be obtained as compared with an analog linear amplifier such as class A and class B amplifiers. Thanks also to its low heat discharge, the class D amplifier is widely used as a speaker drive amplifier. The class D amplifier is operated by causing an amplification active element such as a transistor to perform switching on an input signal such as an audio signal. The class D amplifier performs digital modulation of a PWM (pulse width modulation) signal based on an input audio signal, performs power amplification for the PWM signal, and supplies the power-amplified PWM signal to a speaker.

In PTL 1, a digital amplifier that drives a speaker is disclosed. The digital amplifier disclosed in PTL 1 obtains digital pulse output by performing signal processing and performing digital pulse width modulation on a digital analog signal. Then, this digital amplifier corrects distortion by feeding back the state of the output stage for pulse waveform edge delay, and achieves a reduction in distortion in a part in which a digital pulse that drives the speaker has been converted to an analog signal.

The digital amplifier disclosed in PTL 1 performs demodulation from digital amplifier output passed through a low-pass filter to an analog signal. The digital amplifier employs the above-described method as a method of improving distortion of an analog signal that drives a speaker.

CITATION LIST

Patent Literature

PTL 1
Japanese Patent Application Laid-Open No. 2001-517393

SUMMARY OF INVENTION

Technical Problem

The digital amplifier disclosed in PTL 1 is of a type that can only correct the pulse width within the range of an edge delay correction of up to half the minimum pulse width. Consequently, in the case of modulation of the digital pulse width, the distortion correction amount is up to the minimum pulse width. Therefore, there is a problem in that the correction amount can only be in a range of correction of up to one level above or below the digital pulse width, and distortion such as must be corrected by exceeding one level above or below the digital pulse width cannot be corrected. That is to say, in the case of PWM output, there is a problem of correction of a distortion factor only being able to be performed at one level of a digital pulse when delayed to the maximum.

It is an object of the present invention to provide a digital amplifier capable of widening the range of correction of a duty of a pulse in digital pulse width modulation and improving a distortion factor.

Solution to Problem

A digital amplifier of the present invention receives a digital signal and drives a speaker directly with the digital signal, and employs a configuration having: a digital modulation circuit that performs digital pulse width modulation on digital audio data; a first analog audio output section that performs low-pass filtering of a pulse voltage that is output from the digital modulation circuit and outputs an analog audio voltage; a triangular wave generation circuit that generates an amplitude-modulated triangular wave based on a value of a modulation width of the digital pulse width modulation; a drive circuit that amplifies an output voltage from the triangular wave generation circuit; a second analog audio output section that performs low-pass filtering of a signal power-amplified by the drive circuit and outputs audio band analog power; and an error amplifier that computes and amplifies a voltage difference between a voltage of the first analog audio output section and a voltage of the second analog audio output section, wherein the triangular wave generation circuit adds an error from the error amplifier to a signal corresponding to the value of the modulation width of the digital pulse width modulation and regenerates a digital pulse width modulation waveform.

Advantageous Effects of Invention

The present invention makes it possible to correct a digital pulse width value such that the value exceeds one level above or below the digital pulse width value for all pulse widths of digital pulse width modulation. By this means, the duty of digital pulse width modulation can be corrected by being changed in a range from 0% to 100%, and for digital amplifier distortion occurring from the drive circuit onward, a modulation width value of digital pulse width modulation can be corrected from 0 to a maximum value. Therefore; distortion included in an analog signal demodulated by passing a digital pulse width modulation signal for driving a speaker through a low-pass filter can be significantly improved.

DESCRIPTION OF EMBODIMENT

Now, an embodiment of the present invention will be described in detail with reference to the accompanying drawings.

(Explanation of Principle)

First, the basic idea of the present invention will be explained.

A conventional digital amplifier that drives a speaker is of a type that uses a PWM signal directly without feedback, or uses a feedback circuit limited to low frequencies, or is limited to the minimum pulse width of a PWM signal even though there is a feedback path. Thus, the conventional digital amplifier has limited ability to handle distortion that is generated in a switching circuit and a speaker drive LPF circuit, and is generated by speaker load.

Taking into consideration the fact that a conventional digital amplifier is limited to a type that performs adding and subtracting in pulses, and cannot perform feedback control, the present inventor had the idea of using the number of levels of a quantizer that quantizes a digital signal for integration constant switching of a triangular wave generation circuit, and generating a triangular wave corresponding to the number of levels. A triangular wave generation circuit has a circuit configuration having local analog feedback. By this means, a reduction in distortion is achieved, and when distortion does not occur a digital signal does not degrade without change.

Figure 1:
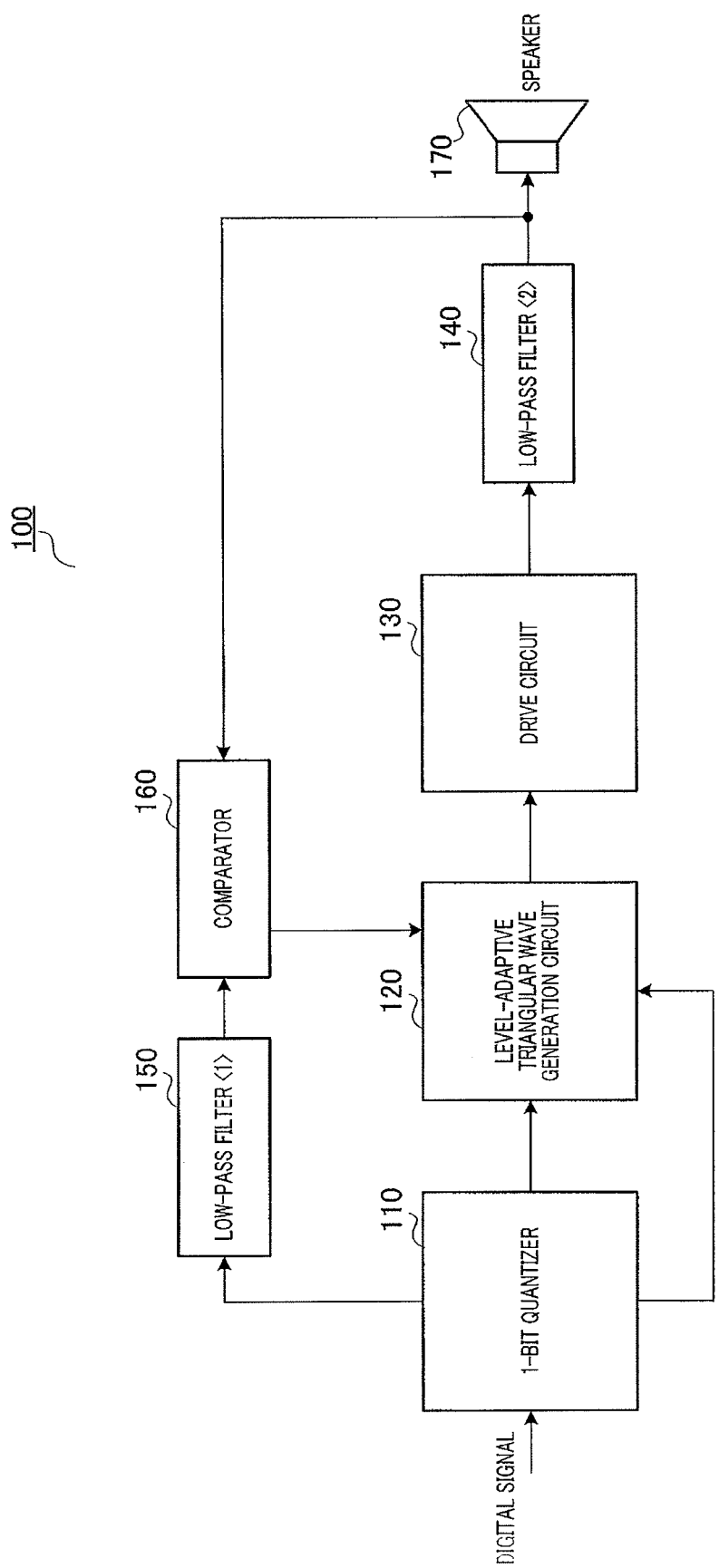
FIG. 1 is a drawing showing a basic configuration of a digital amplifier for explaining the principle of the present invention.

FIG. 1 is a drawing showing a basic configuration of a digital amplifier that inputs a digital signal and drives a speaker using the digital signal as is.

In FIG. 1, digital amplifier 100 is provided with 1-bit quantizer 110, level-adaptive triangular wave generation circuit 120, drive circuit 130, low-pass filters 140 (low-pass filter <2>) (second analog audio output section) and 150 (low-pass filter <1>) (first analog audio output section), comparator 160, and speaker 170.

One-bit quantizer 110 quantizes a digital signal.

Level-adaptive triangular wave generation circuit 120 converts a pulse signal from 1-bit quantizer 110 to a triangular wave, and performs amplitude modulation of the generated triangular wave according to the value of the modulation width of digital pulse width modulation. Level-adaptive triangular wave generation circuit 120 uses a direct current potential corresponding to the number of levels of 1-bit quantizer 110 superimposed on a triangular wave, and generates a triangular wave corresponding to the number of levels.

Drive circuit 130 power-amplifies a PWM signal from level-adaptive triangular wave generation circuit 120.

Low-pass filter 140 (low-pass filter <2>) demodulates pulse power power-amplified by drive circuit 130 to audio band analog power.

Low-pass filter 150 (low-pass filter <1>) outputs an analog audio voltage from a pulse voltage that has undergone digital pulse width modulation by 1-bit quantizer 110.

Comparator 160 computes and amplifies a voltage difference between the voltage of low-pass filter 150 and the voltage of low-pass filter 140.

Speaker 170 converts the power of an analog audio signal to acoustic energy.

With the above configuration, digital amplifier 100 converts a pulse signal from 1-bit quantizer 110 to a triangular wave by means of level-adaptive triangular wave generation circuit 120, and outputs this triangular wave to drive circuit 130.

When outputting a signal converted to a triangular wave by level-adaptive triangular wave generation circuit 120 to drive circuit 130, digital amplifier 100 separately converts output from 1-bit quantizer 110 to an analog signal by means of low-pass filter 150, and conducts this analog signal to comparator 160. A signal that drives speaker 170 is also conducted to comparator 160. Comparator 160 computes and amplifies a voltage difference between low-pass filter 150 and low-pass filter 140. Level-adaptive triangular wave generation circuit 120 modulates the triangular wave based on the above difference.

Thus, using a circuit configuration having local analog feedback enables low-distortion speaker drive output to be obtained.

Embodiment

Figure 2:
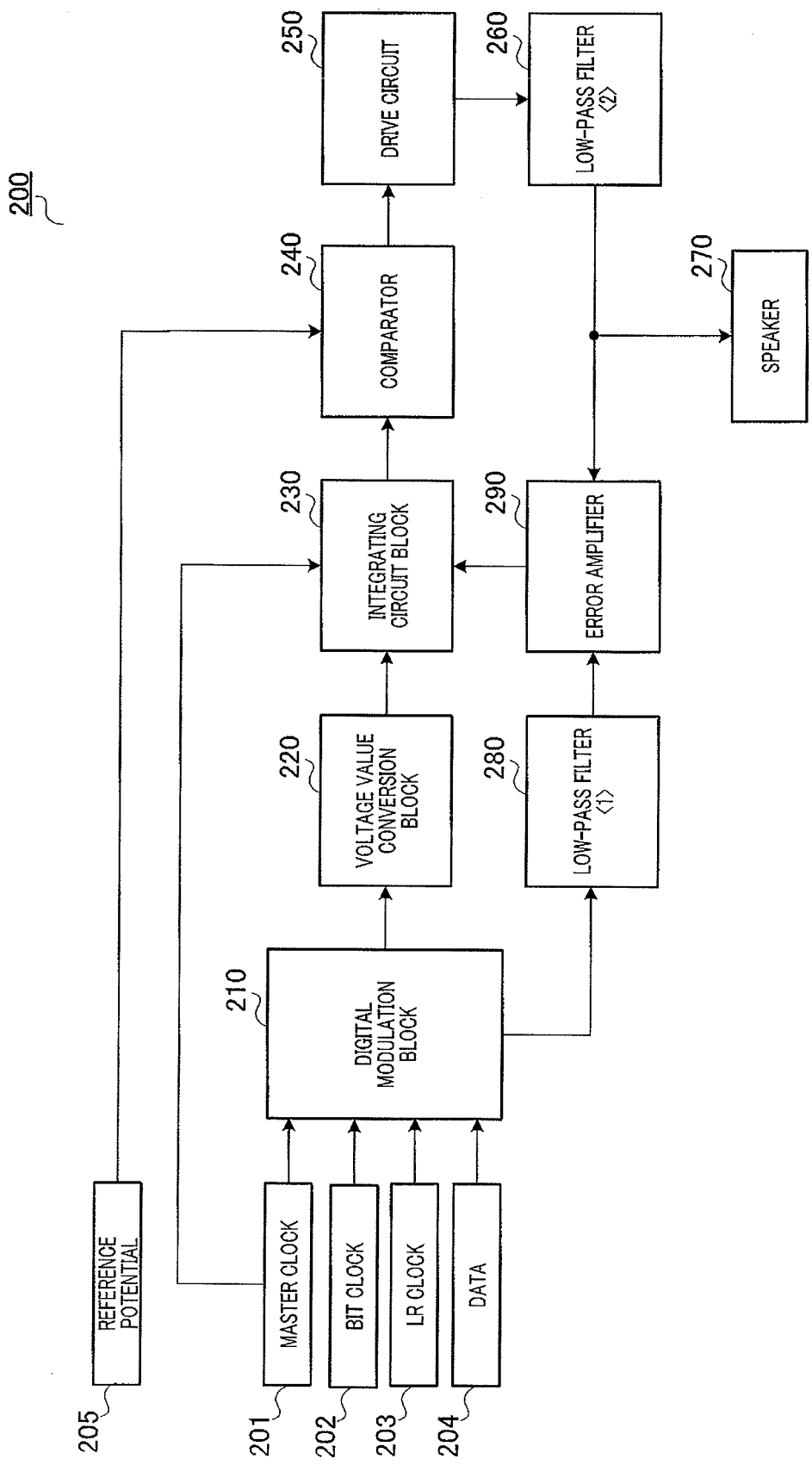
FIG. 2 is a drawing showing a configuration of a digital amplifier according to an embodiment of the present invention.

FIG. 2 is a drawing showing a configuration of a digital amplifier according to an embodiment of the present invention based on the above basic idea. This embodiment is an example of application to a digital amplifier that drives a speaker.

As shown in FIG. 2, digital amplifier 200 is provided with digital modulation block 210, voltage value conversion block 220, integrating circuit block 230, comparator 240, drive circuit 250, low-pass filter 260 (low-pass filter <2>), speaker 270, low-pass filter 280 (low-pass filter <1>), and error amplifier 290.

Master clock 201, bit clock 202, LR clock 203, digital serial data 204, and reference potential 205 are input to digital amplifier 200.

Master clock 201 is a clock for computing digital pulse width modulation and a digital value of a digital pulse width. Master clock 201 is connected to digital modulation block 210 and integrating circuit block 230. Master clock 201 obtains digital pulse width modulation output of digital modulation block 210 and a digital pulse width value, and is connected to integrating circuit block 230 and generates a triangular wave signal in integrating circuit block 230.

Bit clock 202 is connected to digital modulation block 210, and latches digital serial data 204 in digital modulation block 210.

LR clock 203 is connected to digital modulation block 210, and discriminates between an L-channel and R-channel of data latched by bit clock 202. LR clock 203 is a clock for discriminating between L-channel data and R-channel data of digital serial data 204, which are switched between at the timing when they arrive alternately.

Digital serial data 204 is two's complement digital audio data that represents amplitude. Digital serial data 204 is connected to digital modulation block 210, and is sampled in LR clock cycles.

Reference potential 205 is the reference potential of comparator 240.

Digital modulation block 210 includes, for example, a timing generator that generates the timing of each section, a quantizer that requantizes a PCM signal as a digital 1-bit signal, and so forth, and is connected to master clock 201, bit clock 202, LR clock 203, and digital serial data 204.

Digital modulation block 210 converts digital audio data to digital pulse width modulation. Digital modulation block 210 outputs a digital pulse width modulation voltage to voltage value conversion block 220, and outputs a digital value of a digital pulse width to low-pass filter 280 (low-pass filter <1>).

Voltage value conversion block 220 is connected to digital modulation block 210, and converts a digital value of a digital pulse width of digital modulation block 210 to a voltage value.

Integrating circuit block 230 is connected to master clock 201, voltage value conversion block 220, and error amplifier 290, and performs amplitude modulation of a triangular wave voltage generated from master clock 201 and outputs the resulting voltage.

To be specific, integrating circuit block 230 generates a triangular wave by means of master clock 201, and modulates the generated triangular wave based on a signal corresponding to a value of the modulation width of digital pulse width modulation converted to a voltage value from voltage value conversion block 220. Here, in particular, a voltage output from error amplifier 290 is added to the voltage obtained by converting the value of the modulation width of digital pulse width modulation to the voltage value. Integrating circuit block 230 adds error from the error amplifier to the signal corresponding to the value of the modulation width of digital pulse width modulation to regenerate a digital pulse width modulation waveform.

Comparator 240 is connected to integrating circuit block 230 and reference potential 205, and outputs power as a result of comparing the output voltage of integrating circuit block 230 with the voltage of reference potential 205. By outputting the result of the comparison with the voltage of reference potential 205, comparator 240 corrects the duty of a pulse in voltage value conversion block 220 and integrating circuit block 230.

Drive circuit 250 amplifies digital pulse width modulation power from comparator 240.

Low-pass filter 260 (low-pass filter <2>) receives power output of drive circuit 250, and outputs analog audio power. To be specific, low-pass filter 260 (low-pass filter <2>) demodulates pulse power resulting from power amplification of a signal from comparator 240 by means of drive circuit 250 to audio band analog power, and outputs analog audio power. The analog audio power is input to a power input terminal of speaker 270 and a voltage input terminal of error amplifier 290.

Speaker 270 receives the power output of low-pass filter 260 (low-pass filter <2>), and converts this to acoustic energy. To be specific, speaker 270 receives an analog audio signal obtained by passing an audio band and attenuating an unnecessary high band from power from drive circuit 250 by means of low-pass filter 260 (low-pass filter <2>), and converts the received power to acoustic energy.

Low-pass filter 280 (low-pass filter <1>) is an apparatus for obtaining an analog audio signal by passing an audio band and an attenuating unnecessary high band, and has the same frequency characteristic as low-pass filter 260 (low-pass filter <2>).

Low-pass filter 280 (low-pass filter <1>) outputs an analog audio voltage from a pulse voltage that has undergone digital pulse width modulation. Low-pass filter 280 (low-pass filter <1>) performs low-pass filtering from an output voltage of digital modulation block 210 and digital pulse width modulation voltage output, and is connected to a voltage input terminal that obtains analog audio voltage output, and outputs an analog audio voltage.

Error amplifier 290 connects the output voltage of low-pass filter 280 (low-pass filter <1>) to a first voltage input terminal, connects the output voltage of low-pass filter 260 (low-pass filter <2>) to a second voltage input terminal, and computes and amplifies a voltage difference between the voltage of low-pass filter 280 (low-pass filter <1>) and low-pass filter 260 (low-pass filter <2>).

Figure 3:
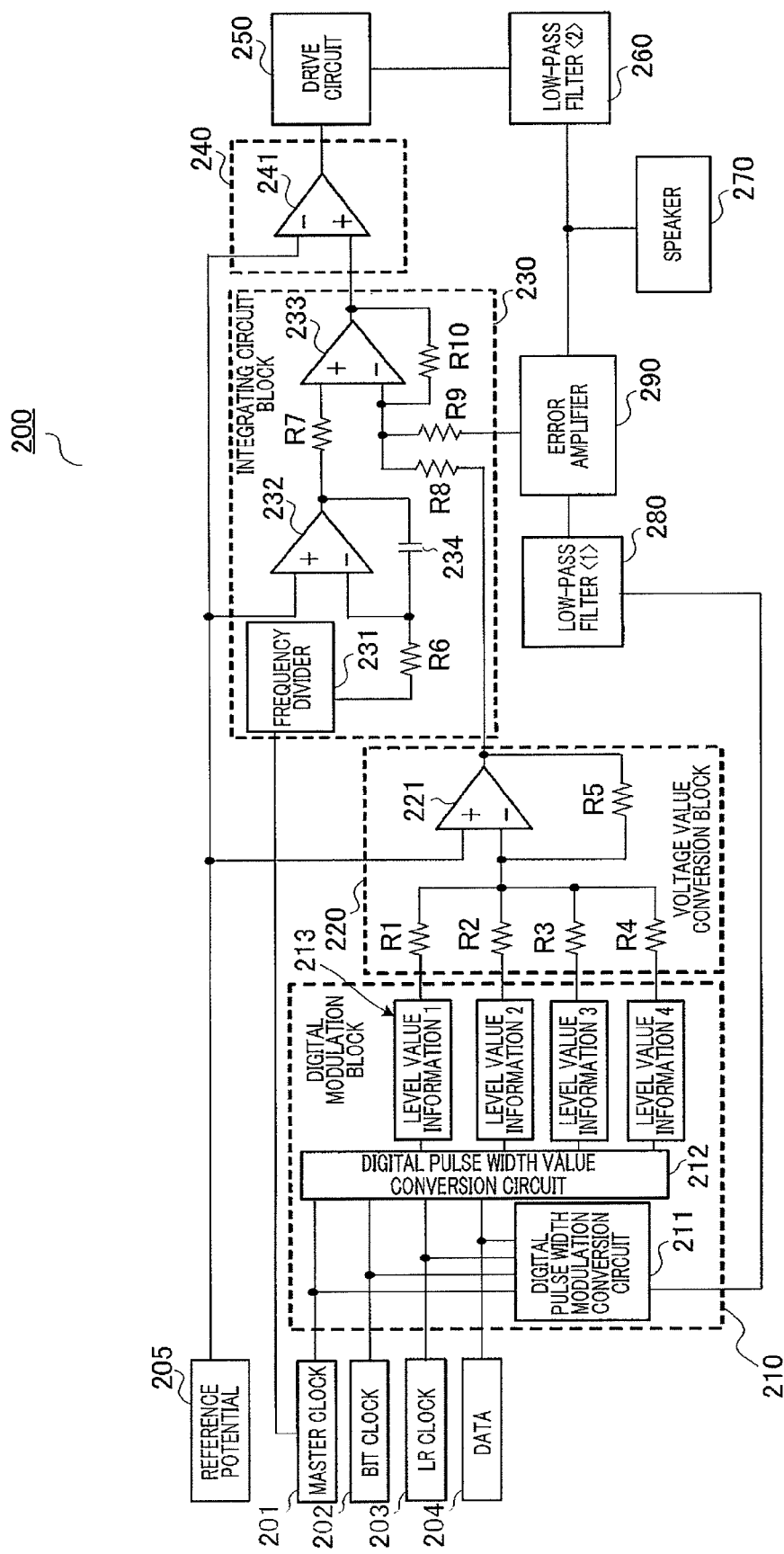
FIG. 3 is a circuit diagram showing an actual configuration of the digital amplifier in FIG. 2.

FIG. 3 is a circuit diagram showing the actual configuration of digital amplifier 200 in FIG. 2. Components identical to those in FIG. 2 are assigned the same reference signs as in FIG. 2.

The present embodiment describes an example in which there are five digital pulse level values in level value of digital pulse width modulation 0, level value 1, level value 2, level value 3, and level value 4.

As shown in FIG. 3, digital modulation block 210 includes digital pulse width modulation conversion circuit 211 that converts digital audio data to digital pulse width modulation, digital pulse width value conversion circuit 212 that converts digital audio data to a digital pulse width value, and level value information storage section 213 that stores level value information 1 through 4.

Voltage value conversion block 220 includes operational amplifier 221 and resistors R1 through R5.

Integrating circuit block 230 includes frequency divider 231, operational amplifiers 232 and 233, capacitor 234, and resistors R6 through R10. Operational amplifier 232, capacitor 234, and resistor R6 form an integrator.

Comparator 240 includes operational amplifier 241.

This embodiment is not limited to five digital pulse width modulation levels, and may employ any other number of levels.

The operation of digital amplifier 200 configured as described above will now be explained. The operation itself is the same for both channels.

Digital modulation block 210 receives master clock 201, bit clock 202, an LR clock, and digital serial data 204, and performs digital pulse width modulation and outputs a value of the modulation width of the digital pulse width modulation.

Voltage value conversion block 220 is connected to digital modulation block 210, and converts a digital value of a digital pulse width from digital modulation block 210 to a voltage value corresponding to the digital value of the digital pulse width.

Voltage value conversion block 220 converts the value of the modulation width of the digital pulse width modulation received from digital modulation block 210 to a voltage value.

Integrating circuit block 230 receives master clock 201 and converts a frequency-divided pulse to a triangular wave. Integrating circuit block 230 having an input terminal for performing amplitude modulation on a triangular wave, and a terminal that receives a result of error amplifier 290 modulates the triangular wave with a voltage and outputs a triangular wave signal.

Comparator 240 outputs power as a result of comparing the triangular wave signal from integrating circuit block 230 with the voltage of reference potential 205.

Drive circuit 250 amplifies a digital pulse width modulation signal regenerated from comparator 240 to power that drives speaker 270.

Low-pass filter 260 (low-pass filter <2>) demodulates a signal resulting from amplifying power by means of drive circuit 250 to audio band analog power, and outputs analog audio power.

Speaker 270 receives the analog audio signal, and converts the received power to acoustic energy and performs acoustic output.

Here, digital amplifier 200 connects digital pulse width modulation output that is received from digital modulation block 210 to a low-distortion input of low-pass filter 280 (low-pass filter <1>) that is different from the input of low-pass filter 260 and is not connected to speaker 270. Also, an output signal demodulated to an analog signal of low-pass filter 280 (low-pass filter <1>) is connected to a plus terminal of the comparison signal input terminals of error amplifier 290. Furthermore, an output signal demodulated to an analog signal of low-pass filter 260 (low-pass filter <2>) is connected to a minus terminal of the comparison signal input terminals of error amplifier 290.

By means of the above connections, a voltage resulting from amplification of the voltage difference between the analog signal of low-pass filter 280 (low-pass filter <1>) and the analog signal of low-pass filter 260 (low-pass filter <2>) is obtained from error amplifier 290. Then, integrating circuit block 230 adds the voltage received from error amplifier 290 to the voltage obtained by conversion to the voltage value by voltage value conversion block 220.

By this means, the analog signal output that is received from low-pass filter 260 (low-pass filter <2>) is automatically controlled so as to become equal to the output of low-pass filter 280 (low-pass filter <1>), and the distortion factor of the analog signal output from low-pass filter 260 (low-pass filter <2>) is improved.

A detailed explanation will now be given.

A voltage connected to integrating circuit block 230 from error amplifier 290 is a voltage resulting from amplification of the voltage difference between low-pass filter 280 (low-pass filter <1>) and low-pass filter 260 (low-pass filter <2>). For this reason, if there is no difference between the voltage whereby low-pass filter 280 (low-pass filter <1>) and error amplifier 290 are connected and the voltage whereby low-pass filter 260 (low-pass filter <2>) and error amplifier 290 are connected, the voltage output from error amplifier 290 is equal to reference potential 205. In this case, since integrating circuit block 230 receives amplitude modulation only at a voltage resulting from conversion of a digital pulse width from voltage value conversion block 220, which converts a digital pulse width to a voltage value, to a voltage value, a voltage connected to drive circuit 250 from comparator 240 is the same voltage as digital pulse width modulation output from circuit block 210 for obtaining digital pulse width modulation output and a digital pulse width value. That is to say, when there is no distortion of digital amplifier 200 (in particular, no distortion in drive circuit 250 and low-pass filter 260), error amplifier 290 does not output an error component, and therefore an integrator (not shown) of integrating circuit block 230 performs middle point movement, and the same waveform is reconstituted and output from integrating circuit block 230.

On the other hand, with a voltage connected to integrating circuit block 230 from error amplifier 290, a voltage connected to integrating circuit block 230 from error amplifier 290 in the case where there is a difference between the voltage of a signal connecting low-pass filter 280 (low-pass filter <1>) and error amplifier 290 and the voltage of a signal connecting low-pass filter 260 (low-pass filter <2>) to error amplifier 290 is as follows:

Integrating circuit block 230 receives amplitude modulation with a voltage resulting from addition of a signal connected to integrating circuit block 230 from error amplifier 290 to a voltage resulting from conversion of a digital pulse width from voltage value conversion block 220, which converts a digital pulse width to a voltage value, into a voltage value. Consequently, a voltage connected to drive circuit 250 from comparator 240 is a pulse width modulation voltage in which an error has been corrected for digital pulse width modulation output from digital modulation block 210. That is to say, a circuit configuration having local analog feedback enables distortion of digital amplifier 200 (in particular, distortion in drive circuit 250 and low-pass filter 260) to be corrected by generating a reverse component of the distortion component.

Comparator 240 compares a pulse width modulation voltage for which an error has been corrected with reference potential 205. Regenerated pulse width modulation power obtained by a comparison by comparator 240 can exceed one level above or below a digital value of a digital pulse width. Therefore, power can be obtained that has undergone pulse width modulation with a pulse width corrected in a range of 0% to 201% as a pulse width modulation duty.

By means of the above, a greater correction effect than in a conventional technique can be obtained for distortion correction of a digital amplifier that performs digital pulse width modulation. The range of distortion correction can be widened and higher performance can be achieved than with the circuit disclosed in PTL 1.

Next, digital modulation block 210, voltage value conversion block 220, integrating circuit block 230, and comparator 240 will be described with reference to specific examples.

FIGS. 4 through 25 are drawings showing operation waveforms of respective sections.

[Output Waveforms from Digital Modulation Block 210 Corresponding to Digital Pulse Width Modulation Levels]

Figure 4:
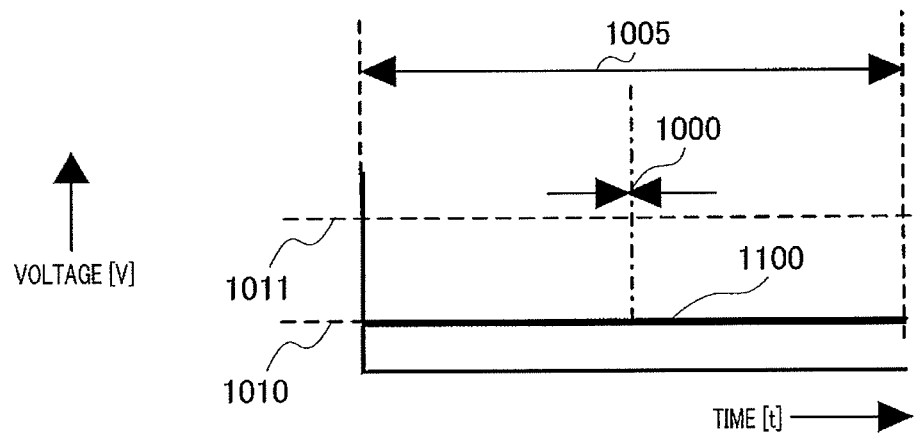
FIG. 4 is a drawing showing an operation waveform of respective sections of the digital amplifier in FIG. 2.

FIG. 4 shows an output waveform output from digital modulation block 210 in the case of level value 0. As shown in FIG. 4, in digital pulse width modulation cycle 1005, waveform 1100 is formed, and is output constantly at voltage 1010.

Figure 5:
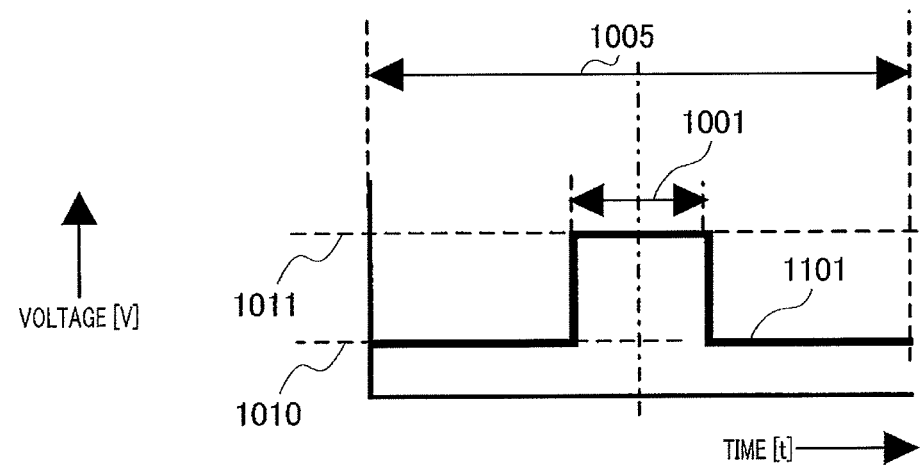
FIG. 5 is a drawing showing an operation waveform of respective sections of the digital amplifier in FIG. 2.

FIG. 5 shows an output waveform output from digital modulation block 210 in the case of level value 1. As shown in FIG. 5, in digital pulse width modulation cycle 1005, waveform 1101 is formed. The voltage is output as a waveform starting from waveform 1010, rising to voltage 1011 for the width of waveform 1001 centered on the middle of cycle 1005, and falling to voltage 1010 again.

Figure 6:
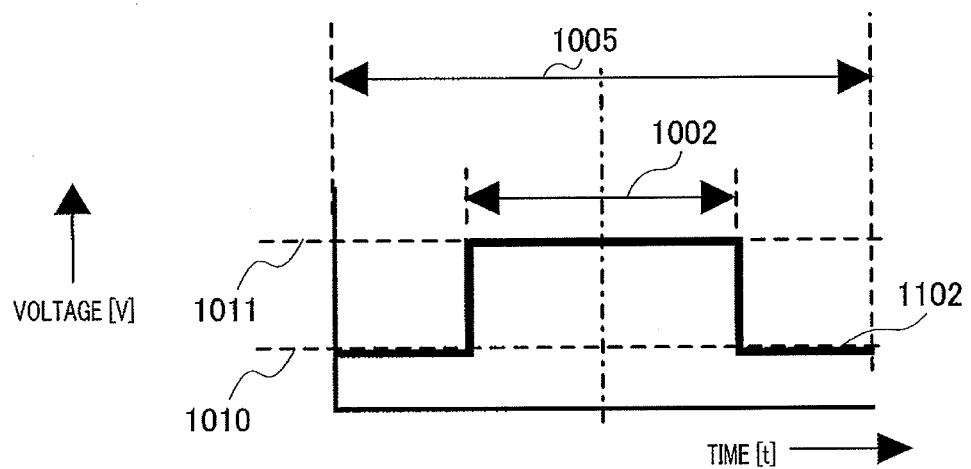
FIG. 6 is a drawing showing an operation waveform of respective sections of the digital amplifier in FIG. 2.

FIG. 6 shows an output waveform output from digital modulation block 210 in the case of level value 2. As shown in FIG. 6, in digital pulse width modulation cycle 1005, waveform 1102 is formed. The voltage is output as a waveform starting from waveform 1010, rising to voltage 1011 for the width of waveform 1002 centered on the middle of cycle 1005, and falling to voltage 1010 again.

Figure 7:
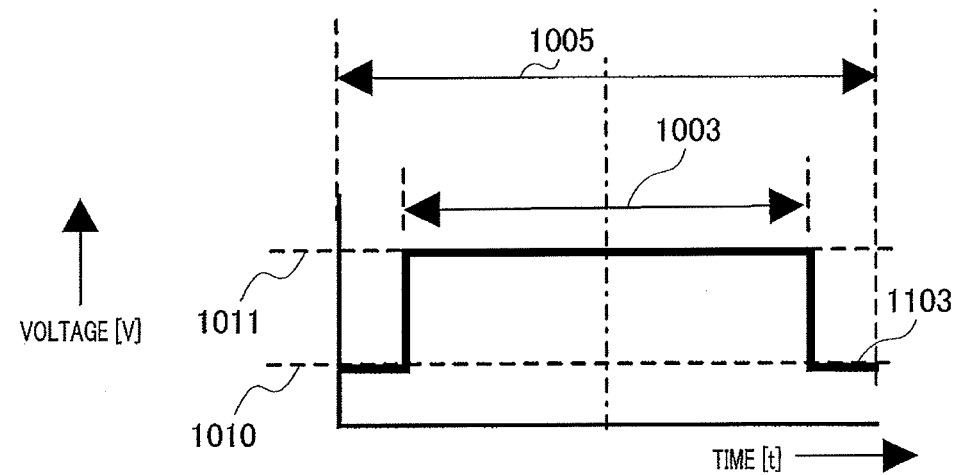
FIG. 7 is a drawing showing an operation waveform of respective sections of the digital amplifier in FIG. 2.

FIG. 7 shows an output waveform output from digital modulation block 210 in the case of level value 3. As shown in FIG. 7, in digital pulse width modulation cycle 1005, waveform 1103 is formed. The voltage is output as a waveform starting from waveform 1010, rising to voltage 1011 for the width of waveform 1003 centered on the middle of cycle 1005, and falling to voltage 1010 again.

Figure 8:
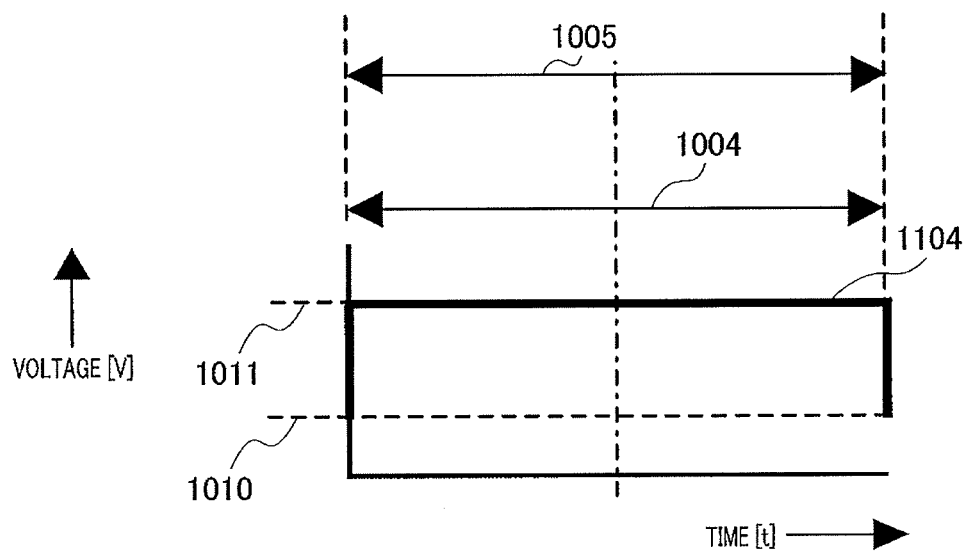
FIG. 8 is a drawing showing an operation waveform of respective sections of the digital amplifier in FIG. 2.

FIG. 8 shows an output waveform output from digital modulation block 210 in the case of level value 4. As shown in FIG. 8, in digital pulse width modulation cycle 1005, waveform 1104 is formed. The voltage is output constantly as voltage 1011 for the width of waveform 1004.

[Output Waveforms of an Output Potential of Digital Pulse Width Value Information Output from Digital Modulation Block 210]

Figure 9:
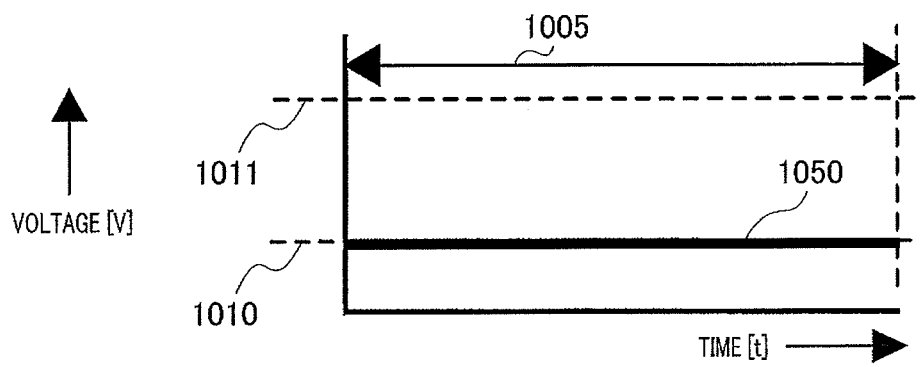
FIG. 9 is a drawing showing an operation waveform of respective sections of the digital amplifier in FIG. 2.

FIG. 9 shows a waveform of a low voltage value of an output potential of digital pulse width value information output from digital modulation block 210. As shown in FIG. 9, a waveform of a low voltage value of an output potential of digital pulse width value information is a waveform output at voltage 1010 and in cycle 1005.

Figure 10:
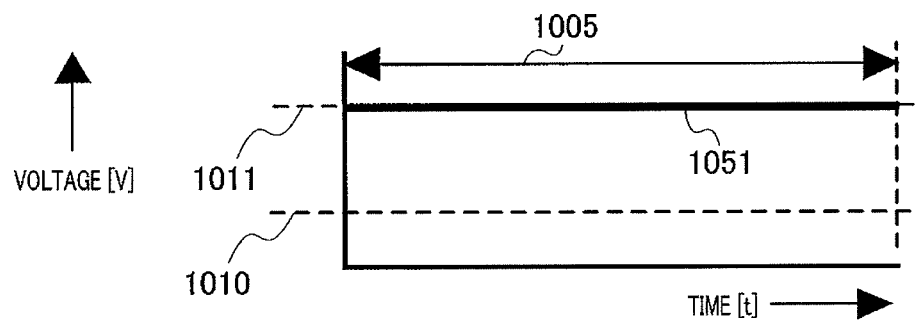
FIG. 10 is a drawing showing an operation waveform of respective sections of the digital amplifier in FIG. 2.

FIG. 10 shows a waveform of a high voltage value of an output potential of digital pulse width value information output from digital modulation block 210. As shown in FIG. 10, a waveform of a high voltage value of an output potential of digital pulse width value information is a waveform output at voltage 1011 and in cycle 1005.

Here, values of level value information (level value information 1, level value information 2, level value information 3, and level value information 4) in digital modulation block 210 change according to a digital pulse width value.

When the level value of the digital pulse width is 0, the values of level value information (level value information 1, level value information 2, level value information 3, and level value information 4) in digital modulation block 210 all correspond to the waveform in FIG. 9.

When the level value of the digital pulse width is 1, among the values of level value information (level value information 1, 2, 3, and 4) in digital modulation block 210, level value information 1 corresponds to the waveform in FIG. 9, and level value information 2 through 4 correspond to the waveform in FIG. 10.

When the level value of the digital pulse width is 2, among the values of level value information (level value information 1, 2, 3, and 4) in digital modulation block 210, level value information 1 and 2 correspond to the waveform in FIG. 9, and level value information 3 and 4 correspond to the waveform in FIG. 10.

When the level value of the digital pulse width is 3, among the values of level value information (level value information 1, 2, 3, and 4) in digital modulation block 210, level value information 1, 2, and 3 correspond to the waveform in FIG. 9, and level value information 4 corresponds to the waveform in FIG. 10.

When the level value of the digital pulse width is 4, the values of level value information (level value information 1, 2, 3, and 4) in digital modulation block 210 all correspond to the waveform in FIG. 10.

[Output Waveforms Corresponding to a Level Value of a Digital Pulse Width Modulation Level Output from Voltage Value Conversion Block 220]

Figure 11:
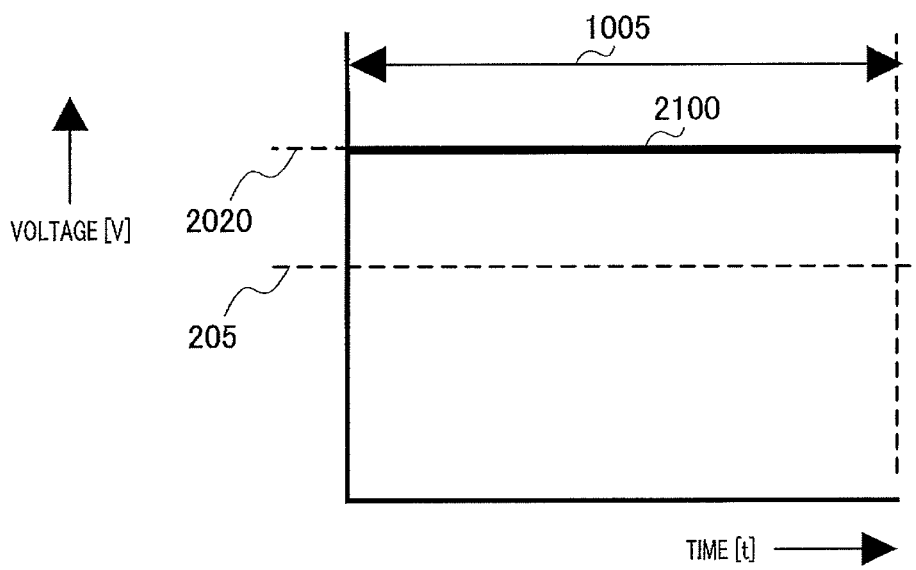
FIG. 11 is a drawing showing an operation waveform of respective sections of the digital amplifier in FIG. 2.
Figure 12:
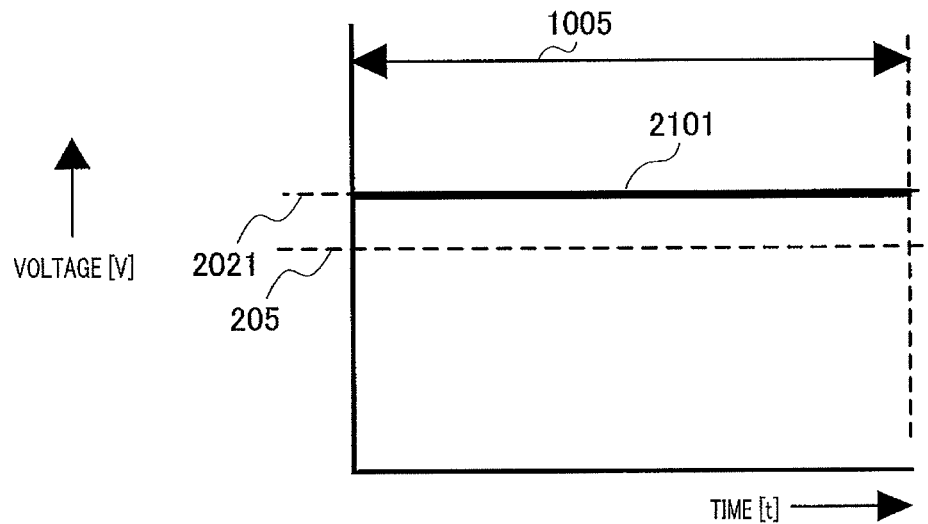
FIG. 12 is a drawing showing an operation waveform of respective sections of the digital amplifier in FIG. 2.
Figure 13:
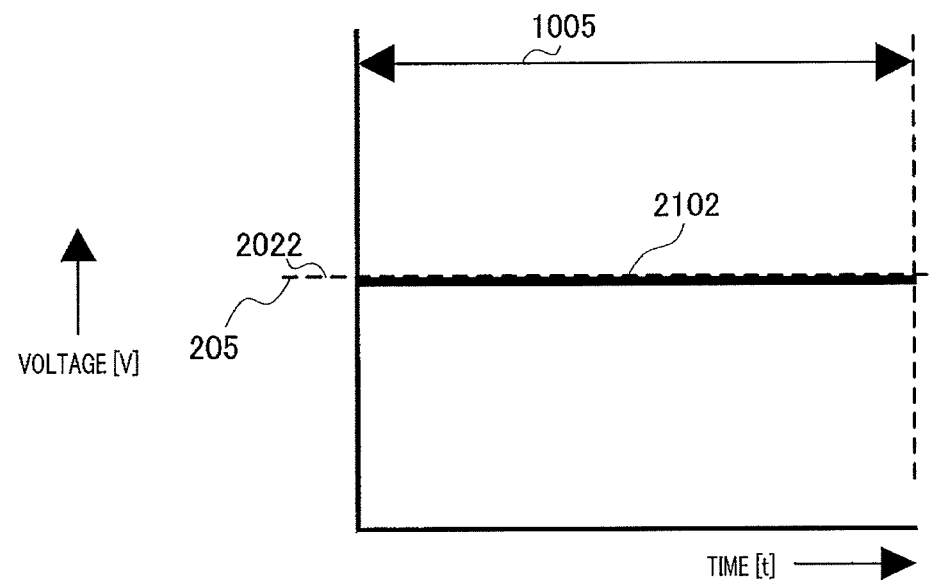
FIG. 13 is a drawing showing an operation waveform of respective sections of the digital amplifier in FIG. 2.
Figure 14:
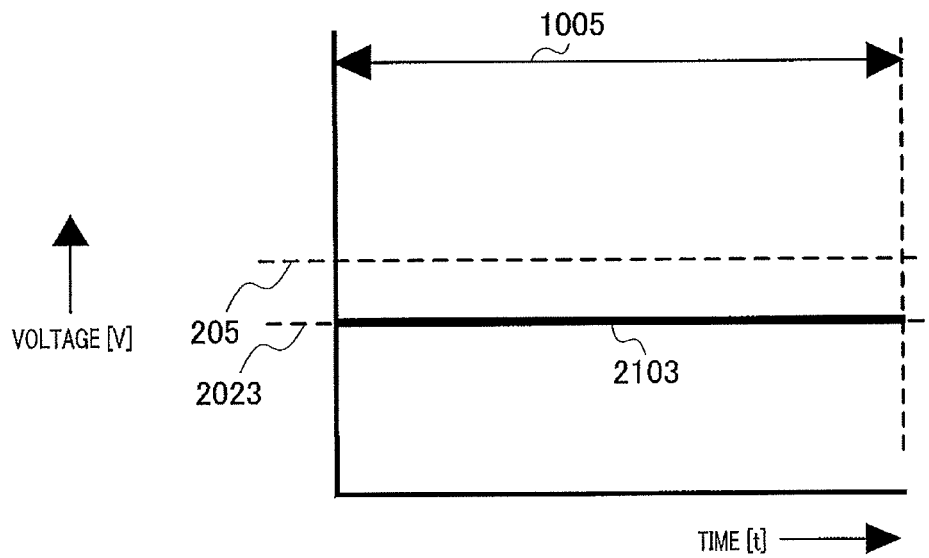
FIG. 14 is a drawing showing an operation waveform of respective sections of the digital amplifier in FIG. 2.
Figure 15:
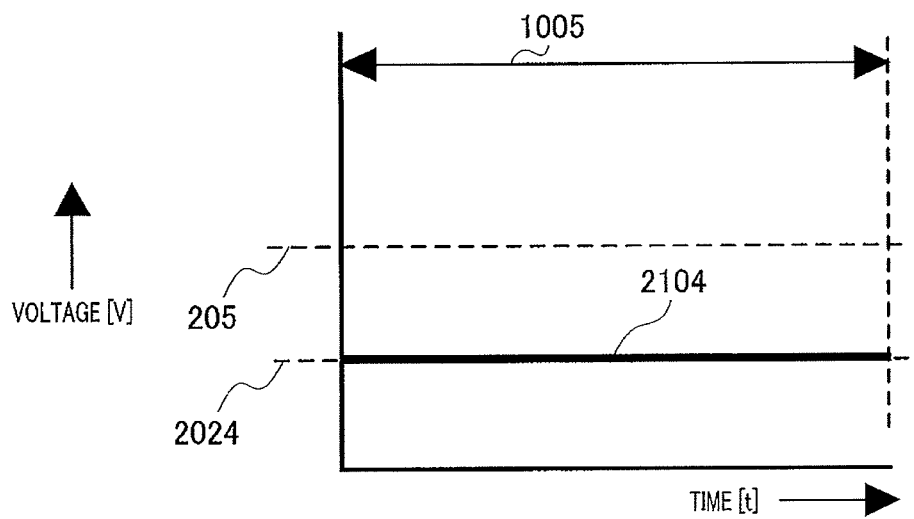
FIG. 15 is a drawing showing an operation waveform of respective sections of the digital amplifier in FIG. 2.

FIG. 11 shows an output waveform when the level value of digital pulse width modulation level output from voltage value conversion block 220 is 0, FIG. 12 shows an output waveform when the level value is 1, FIG. 13 shows an output waveform when the level value is 2, FIG. 14 shows an output waveform when the level value is 3, and FIG. 15 shows an output waveform when the level value is 4.

As shown in FIG. 3, level value information 1, 2, 3, and 4 are connected to level value information input terminals of voltage value conversion block 220, and reference potential 205 is connected to voltage value conversion block 220.

The following output waveforms are output from an output terminal of voltage value conversion block 220 according to the level value of digital pulse width modulation, based on the voltages of level value information 1, 2, 3, and 4.

When the level value of digital pulse width modulation is 0, conversion is performed into waveform 2100 at voltage 2020 in FIG. 11. When the level value of digital pulse width modulation is 1, conversion is performed into waveform 2101 at voltage 2021 in FIG. 12. When the level value of digital pulse width modulation is 2, conversion is performed into waveform 2102 at voltage 2022 in FIG. 13. When the level value of digital pulse width modulation is 3, conversion is performed into waveform 2103 at voltage 2023 in FIG. 14. When the level value of digital pulse width modulation is 4, conversion is performed into waveform 2104 at voltage 2024 in FIG. 15. Here, the midpoint potential of the potentials of voltages 1011 and 1010 is equal to reference potential 205.

[Waveforms Output from Integrating Circuit Block 230, Comparator 240, and Drive Circuit 250]

Figure 16:
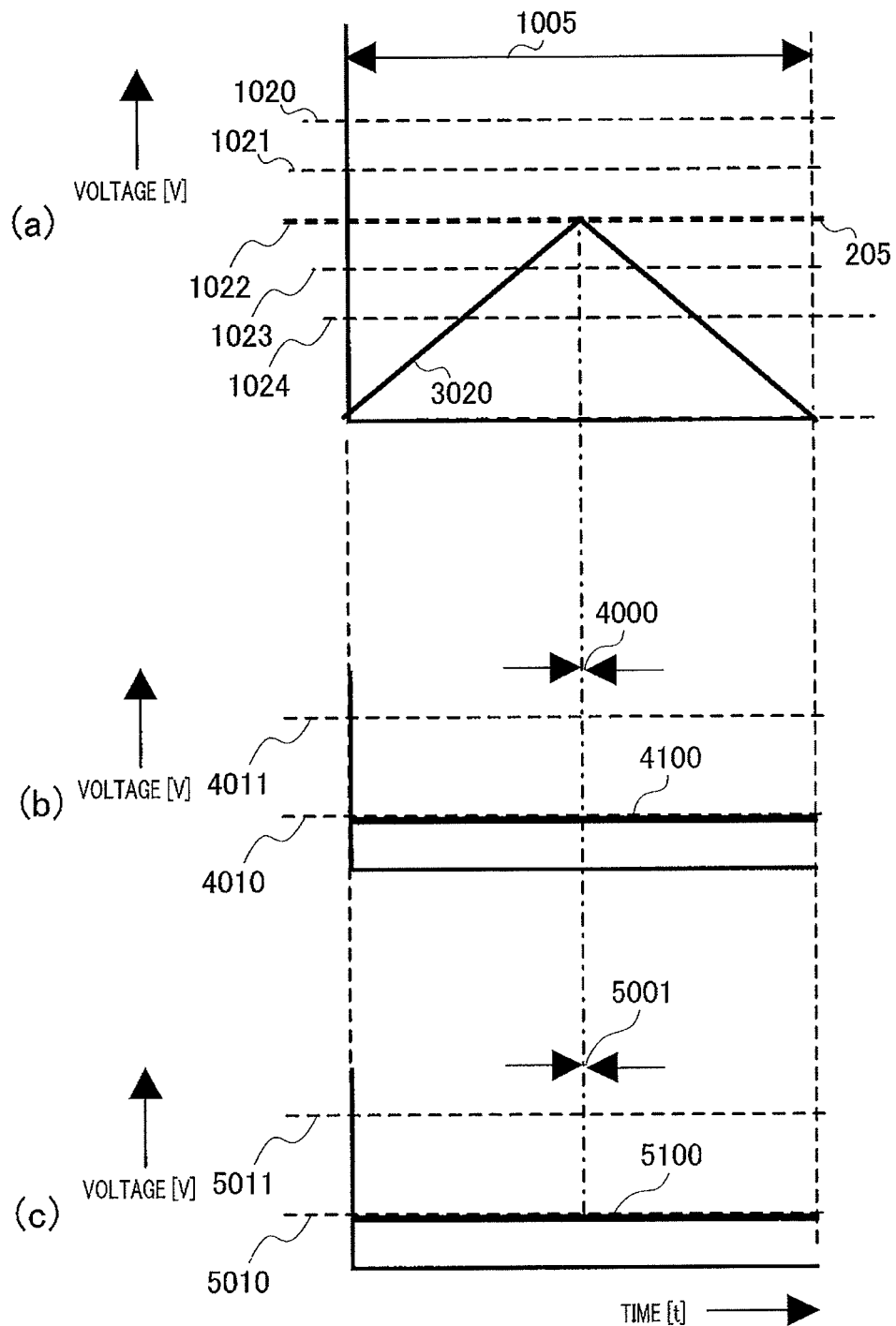
FIG. 16 is a drawing showing operation waveforms of respective sections of the digital amplifier in FIG. 2.
Figure 19:
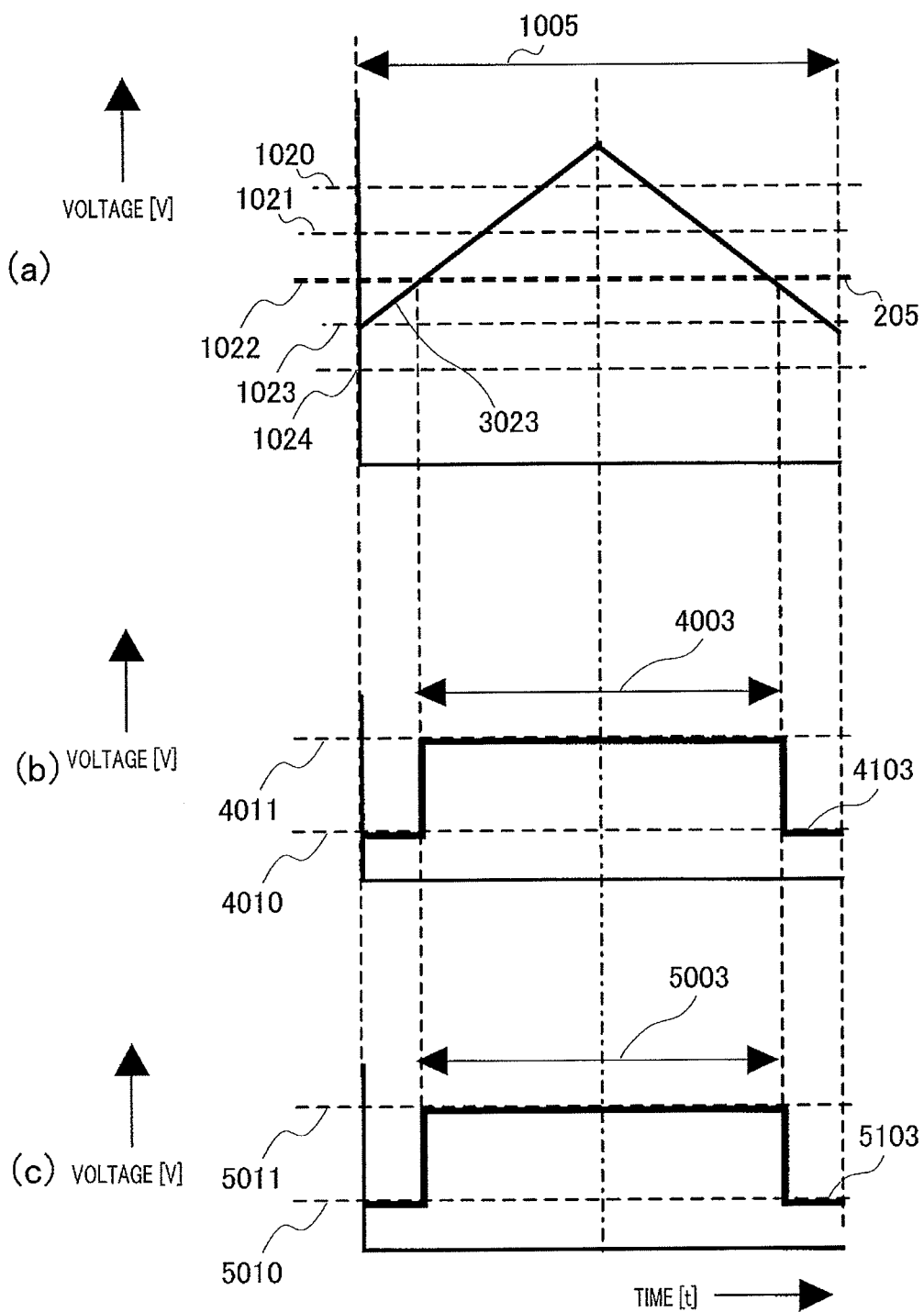
FIG. 19 is a drawing showing operation waveforms of respective sections of the digital amplifier in FIG. 2.
Figure 20:
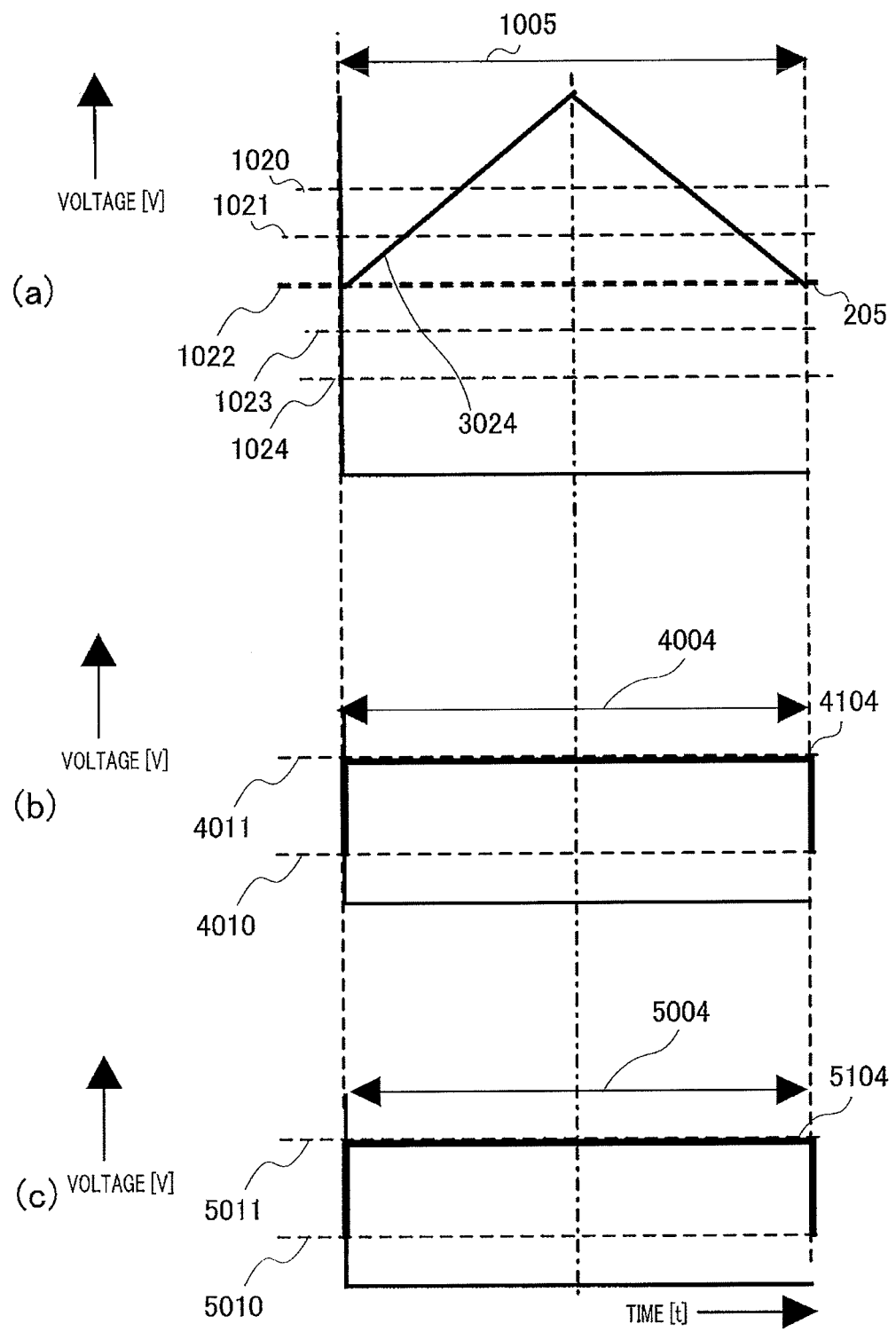
FIG. 20 is a drawing showing operation waveforms of respective sections of the digital amplifier in FIG. 2.

FIG. 16 shows waveforms output from integrating circuit block 230, comparator 240, and drive circuit 250 for level value of digital pulse width modulation 0 when there is no distortion in voltage value conversion block 220, integrating circuit block 230, comparator 240, drive circuit 250, low-pass filter 260 (low-pass filter <2>), or low-pass filter 280 (low-pass filter <1>) in FIG. 3. Similarly, FIG. 17 shows output waveforms when the level value is 1, FIG. 18 shows output waveforms when the level value is 2, FIG. 19 shows output waveforms when the level value is 3, and FIG. 20 shows output waveforms when the level value is 4.

Voltage value conversion block 220 converts a digital value of a digital pulse width of digital modulation block 210 into a voltage value based on the digital pulse width information of digital pulse width modulation. Then, the output result from integrating circuit block 230 when the voltage from error amplifier 290 is reference potential 205 is waveform 3020 shown in FIG. 16(*a*) when the level value of digital pulse width modulation is 0. Also, output from comparator circuit block 240 is waveform 4100 shown in FIG. 16(*b*), and output from drive circuit 250 is waveform 5100 shown in FIG. 16(*c*).

Figure 17:
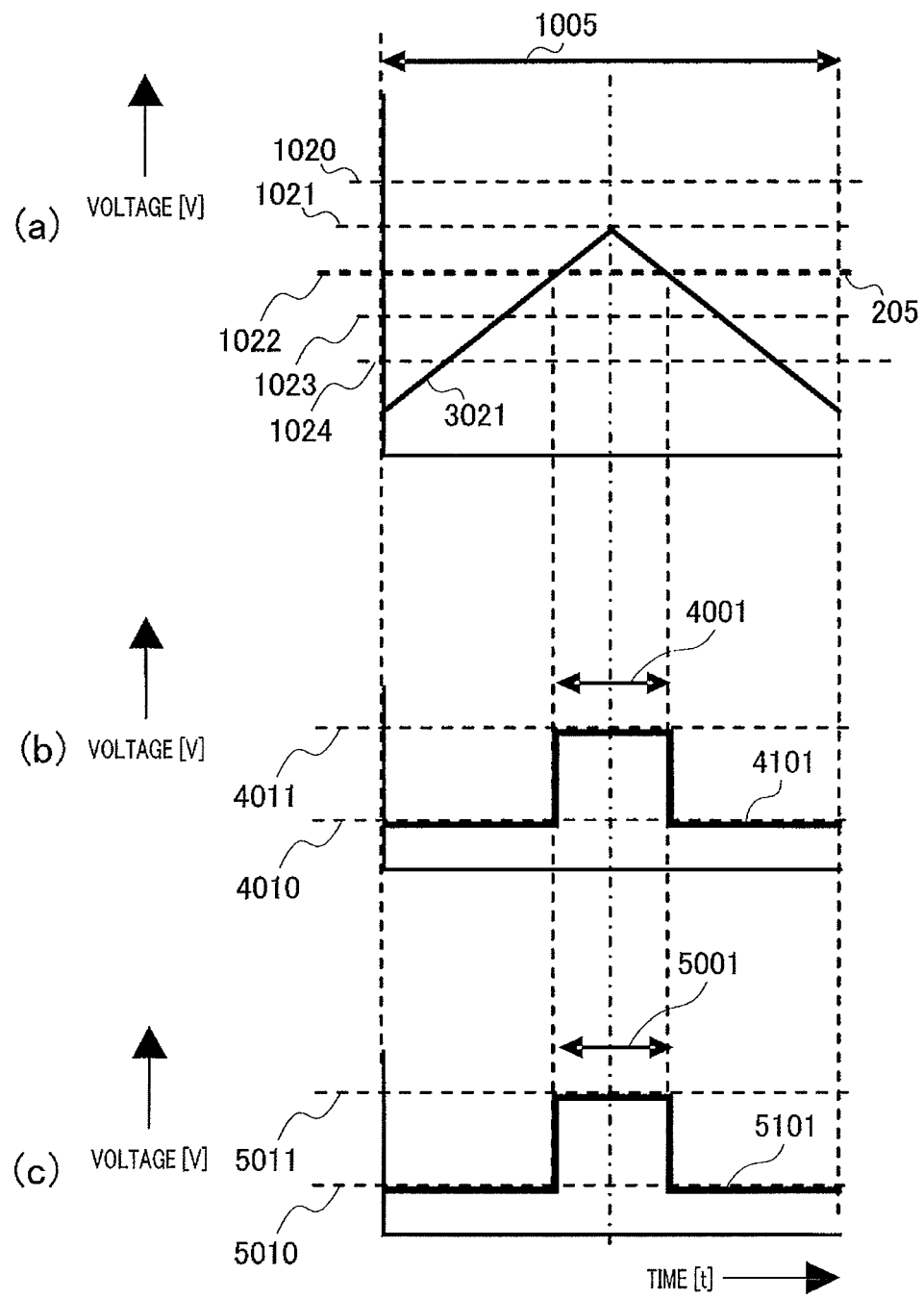
FIG. 17 is a drawing showing operation waveforms of respective sections of the digital amplifier in FIG. 2.

When the level value of digital pulse width modulation is 1, waveform 3021 shown in FIG. 17(*a*) is formed. Also, output from comparator circuit block 240 is waveform 4101 shown in FIG. 17(*b*), and output from drive circuit 250 is waveform 5101 shown in FIG. 17(*c*).

Figure 18:
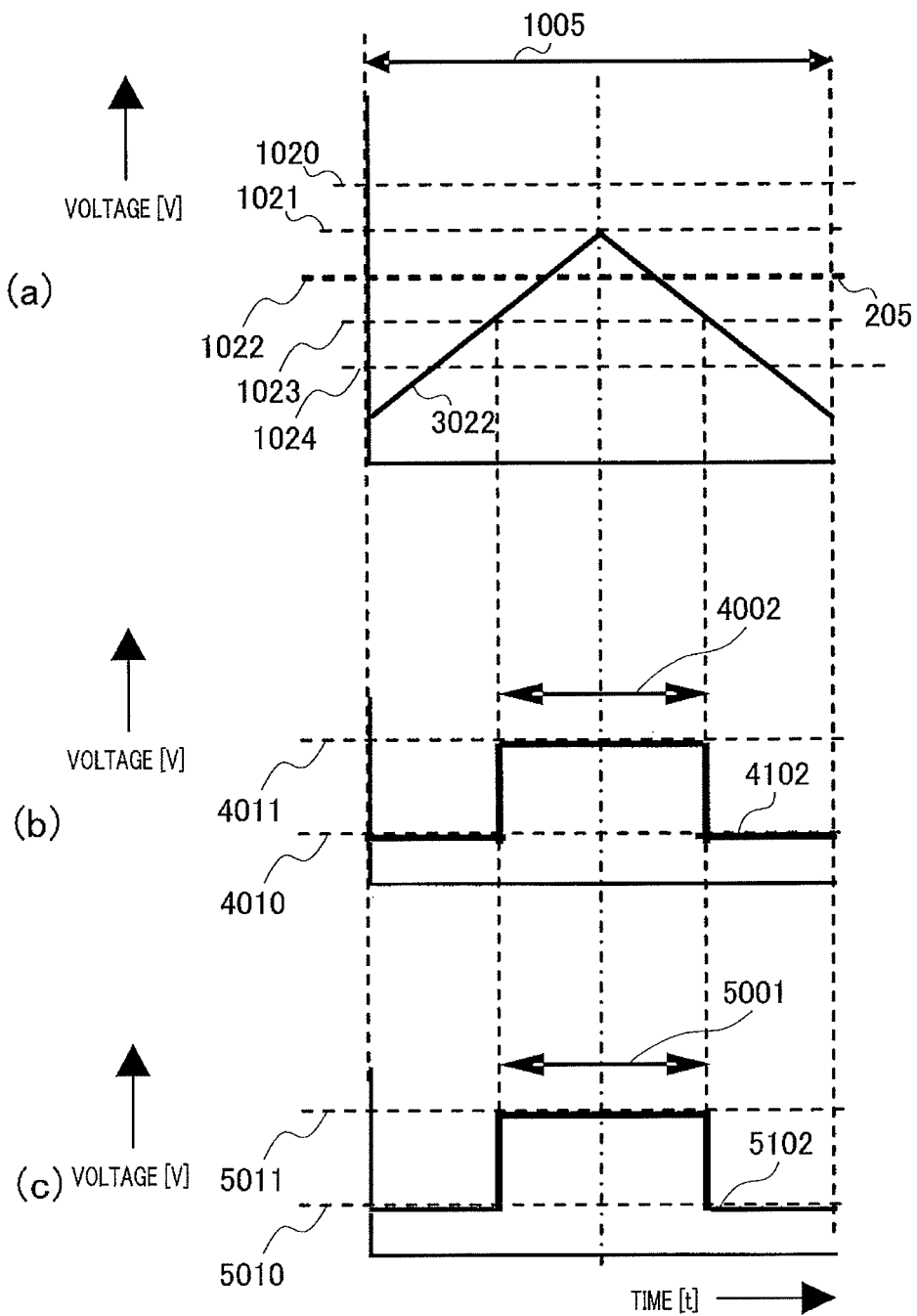
FIG. 18 is a drawing showing operation waveforms of respective sections of the digital amplifier in FIG. 2.

When the level value of digital pulse width modulation is 2, waveform 3022 shown in FIG. 18(*a*) is formed. Also, output from comparator circuit block 240 is waveform 4102 shown in FIG. 18(*b*), and output from drive circuit 250 is waveform 5102 shown in FIG. 18(*c*).

When the level value of digital pulse width modulation is 3, waveform 3023 shown in FIG. 19(*a*) is formed. Also, output from comparator circuit block 240 is waveform 4103 shown in FIG. 19(*b*), and output from drive circuit 250 is waveform 5103 shown in FIG. 19(*c*).

When the level value of digital pulse width modulation is 4, waveform 3024 shown in FIG. 20(*a*) is formed. Also, output from comparator circuit block 240 is waveform 4104 shown in FIG. 20(*b*), and output from drive circuit 250 is waveform 5104 shown in FIG. 20(*c*).

It can be seen that waveform 5100 is a waveform with the same duty as waveform 1100 but a different voltage, waveform 5101 is a waveform with the same duty as waveform 1101 but a different voltage, waveform 5102 is a waveform with the same duty as waveform 1102 but a different voltage, waveform 5103 is a waveform with the same duty as waveform 1103 but a different voltage, and waveform 5104 is a waveform with the same duty as waveform 1104 but a different voltage.

[Waveforms when there is No Distortion Output from Voltage Value Conversion Block 220, Integrating Circuit Block 230, Comparator 240, Drive Circuit 250, Low-Pass Filter 260 (Low-Pass Filter <2>), or Low-Pass Filter 280 (Low-Pass Filter <1>)]

Figure 21:
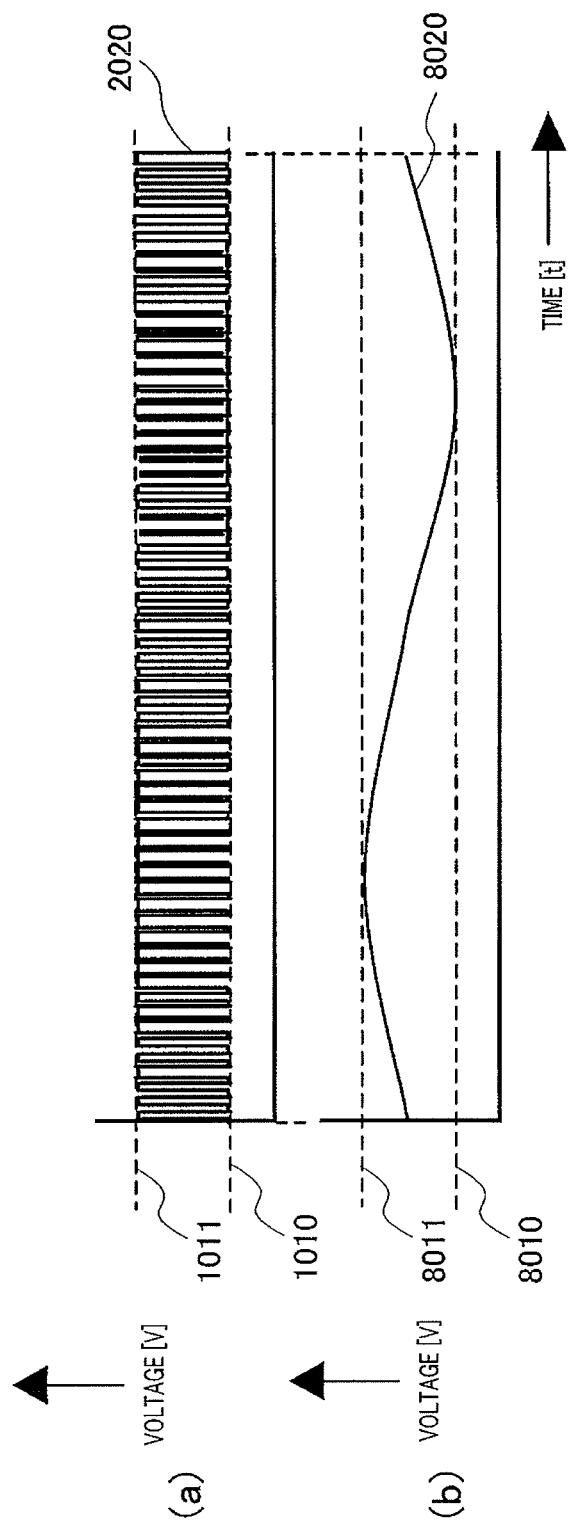
FIG. 21 is a drawing showing operation waveforms of respective sections of the digital amplifier in FIG. 2.
Figure 22:
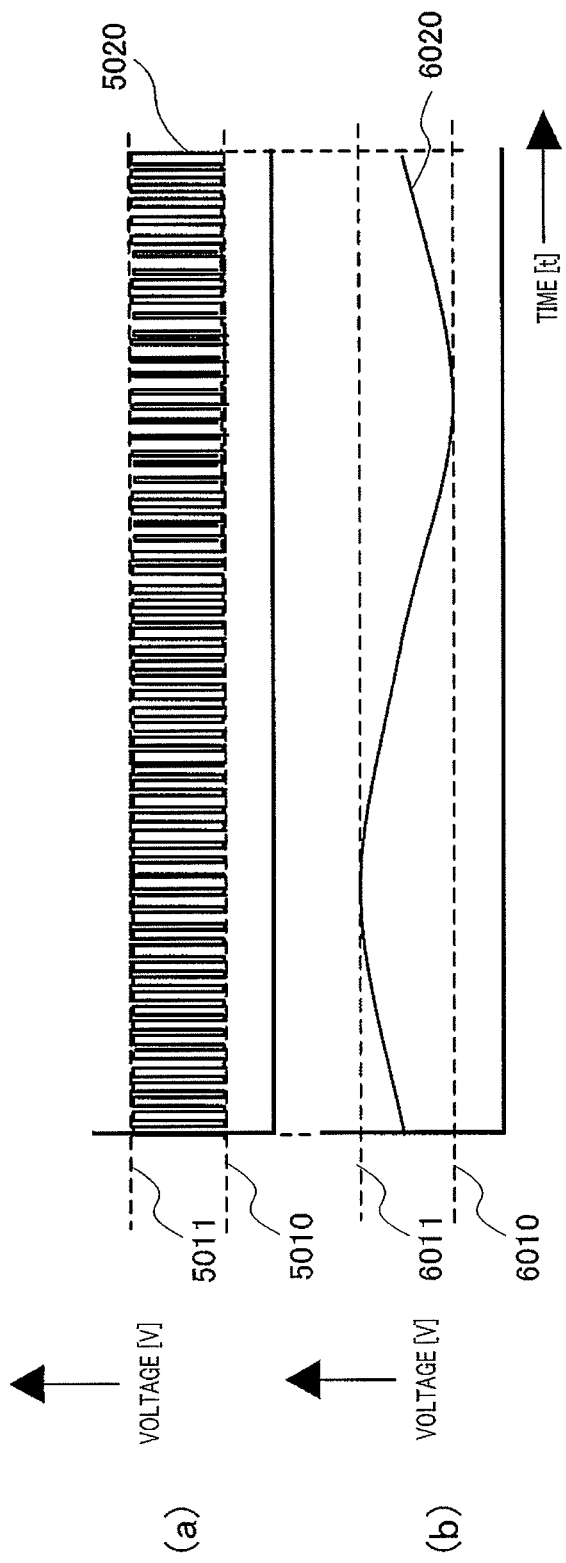
FIG. 22 is a drawing showing operation waveforms of respective sections of the digital amplifier in FIG. 2.

FIG. 21 and FIG. 22 show waveforms when there is no distortion in voltage value conversion block 220, integrating circuit block 230, comparator 240, drive circuit 250, low-pass filter 260 (low-pass filter <2>), or low-pass filter 280 (low-pass filter <1>). FIG. 22 shows waveforms in which, with respect to the waveforms in FIG. 21, only the voltage differs from waveform 8020 obtained by passing output from digital modulation block 210 through low-pass filter 280 (low-pass filter <1>). Waveform 6020 and waveform 8020 are fixed values set to an arbitrary ratio.

[Waveform Output from Voltage Value Conversion Block 220, Integrating Circuit Block 230, Comparator 240, Drive Circuit 250, Low-Pass Filter 260 (Low-Pass Filter <2>), and Low-Pass Filter 280 (Low-Pass Filter <1>) when there is Distortion]

Figure 23:
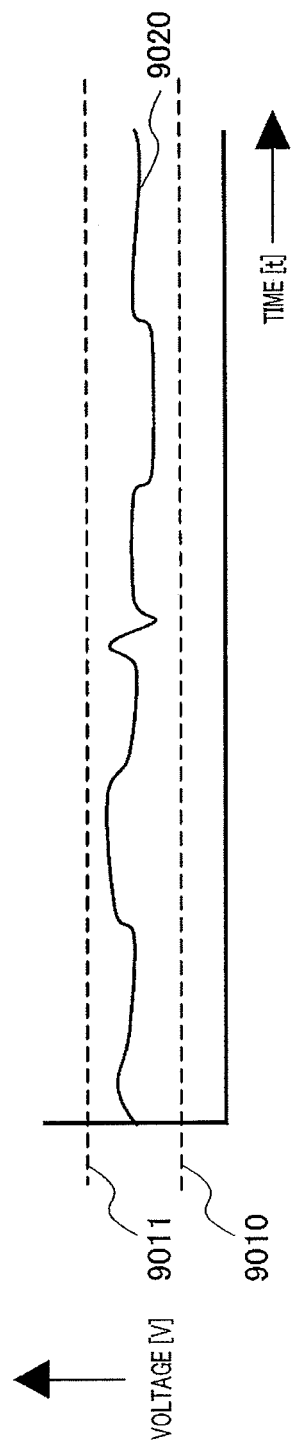
FIG. 23 is a drawing showing an operation waveform of respective sections of the digital amplifier in FIG. 2.

FIG. 23 shows a waveform output from voltage value conversion block 220, integrating circuit block 230, comparator 240, drive circuit 250, low-pass filter 260 (low-pass filter <2>), and low-pass filter 280 (low-pass filter <1>) when there is distortion.

As shown in FIG. 23, when distortion occurs in blocks, a distortion signal appears as shown by waveform 9020 from error amplifier 290 as the sum of the distortion of the blocks. This result is connected to integrating circuit block 230, and integrating circuit block 230 automatically performs an operation that subtracts the distortion so as to make waveform 6020 an analog of a different voltage of waveform 8020.

The example in which distortion of waveform 6020 is corrected will now be described. As a result of correction when the level value of digital pulse width modulation is 2, output from error amplifier 290 is voltage 9020 in FIG. 23.

[Waveforms Output from Comparator 240]

Figure 24:
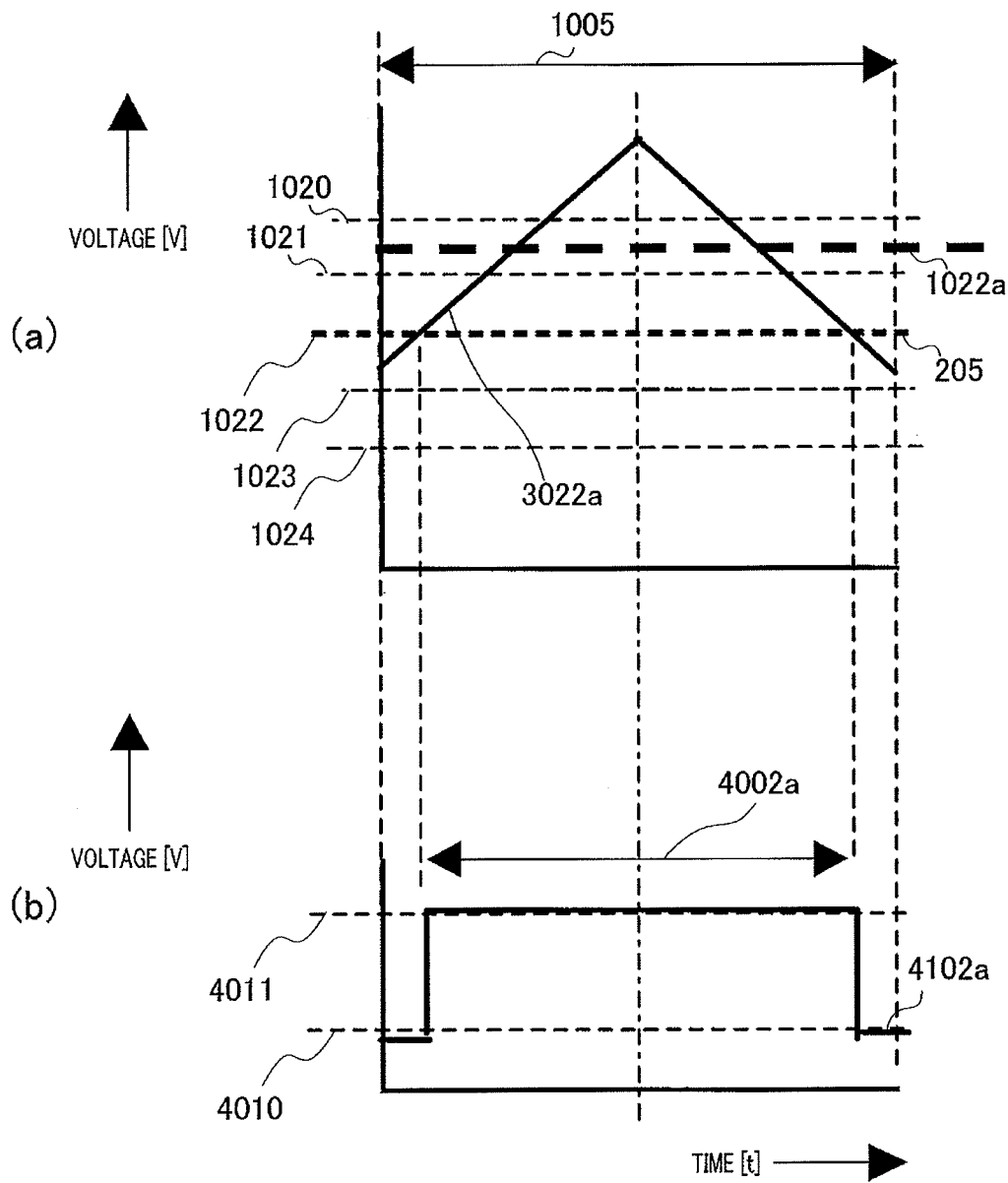
FIG. 24 is a drawing showing operation waveforms of respective sections of the digital amplifier in FIG. 2.

FIG. 24 shows waveforms output from comparator 240 when the level value of digital pulse width modulation is 2 and when the sum of distortion of voltage value conversion block 220, integrating circuit block 230, comparator 240, drive circuit 250, and low-pass filter 260 (low-pass filter <2>) is different from distortion in the output of low-pass filter 280 (low-pass filter <1>), and when the level value of digital pulse width modulation is corrected on the positive side.

As shown in FIG. 24, an output result from comparator 240 that is nearer voltage 9011 than the average of voltage 9011 and voltage 9010 shown in FIG. 23, and that is obtained when distortion is corrected in a direction such that the level value of digital pulse width modulation is incremented by 1 or more, is shown by waveform 4102*a*.

Figure 25:
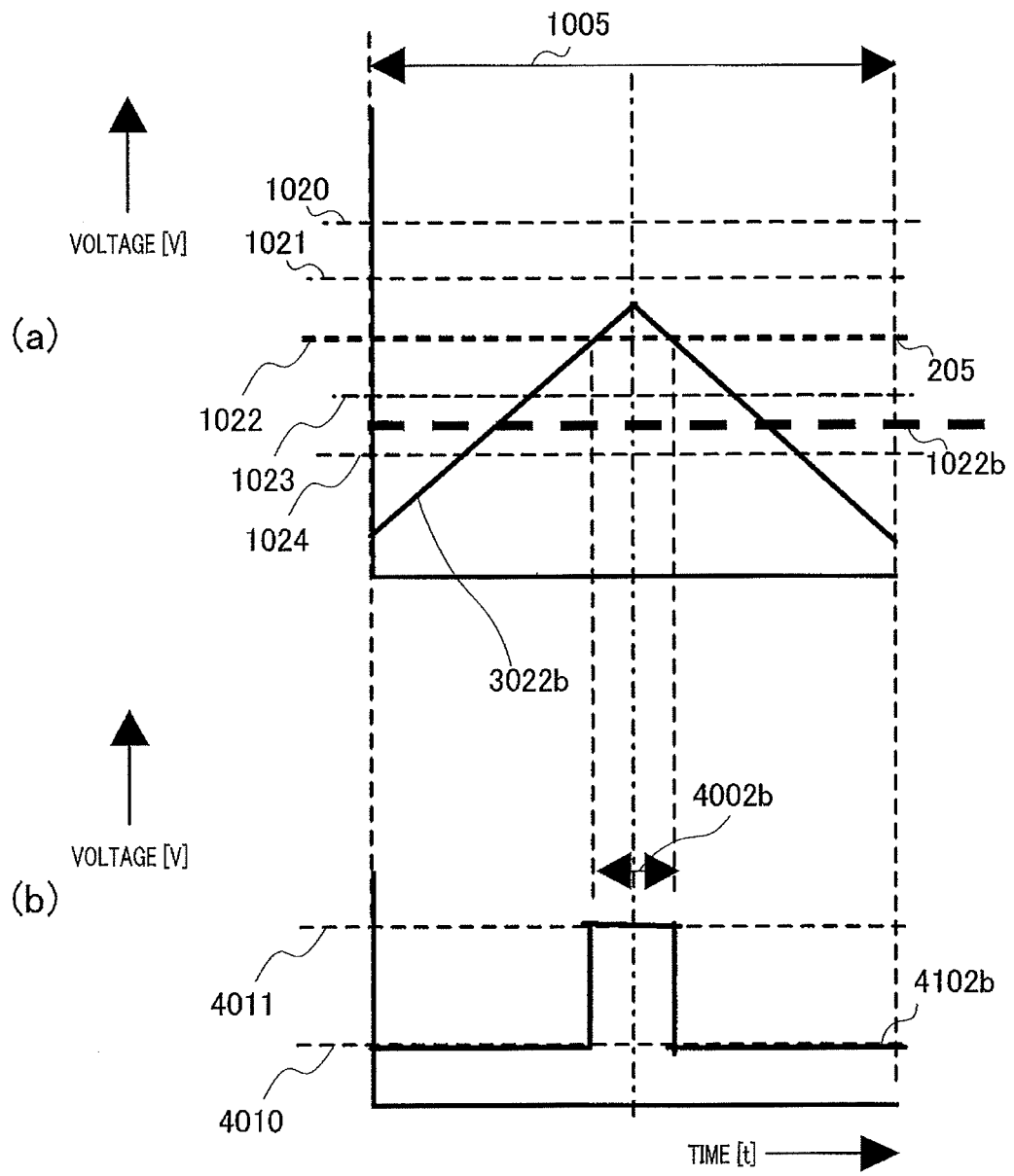
FIG. 25 is a drawing showing operation waveforms of respective sections of the digital amplifier in FIG. 2.

FIG. 25 shows waveforms output from comparator 240 when the level value of digital pulse width modulation is 2 and when the sum of distortion of voltage value conversion block 220, integrating circuit block 230, comparator 240, drive circuit 250, and low-pass filter 260 (low-pass filter <2>) is different from distortion in the output of low-pass filter 280 (low-pass filter <1>), and the level value of digital pulse width modulation is corrected on the negative side.

As shown in FIG. 25, an output result from comparator 240 that is obtained when, as a result of correction when the level value of digital pulse width modulation is 2, when output from error amplifier 290 is voltage 9020 in FIG. 23, and is a level nearer voltage 9010 than the average of voltage 9011 and voltage 9010, and when distortion is corrected in a direction such that the level value of digital pulse width modulation is decremented by 1 or more, is shown by waveform 4102*b*.

Thus, in distortion correction of a digital amplifier that performs digital pulse width modulation, a greater correction effect can be obtained than in a conventional technique. It is possible to widen the range of correction, enabling higher performance to be achieved.

As described above, according to this embodiment, digital amplifier 200 is provided with voltage value conversion block 220 that converts a digital value of a digital pulse width of digital modulation block 210 to a voltage value, and integrating circuit block 230 that generates a triangular wave by means of a master clock and modulates the generated triangular wave based on a signal corresponding to the value of the modulation width of the digital pulse width modulation. Digital amplifier 200 is provided with low-pass filter 280 (low-pass filter <1>) that outputs an analog audio voltage from a pulse voltage that has undergone digital pulse width modulation, comparator 240 that compares an output voltage of voltage value conversion block 220 with the voltage of a reference potential and outputs power according to the comparison result, and drive circuit 250 that amplifies digital pulse width modulation power from comparator 240. Digital amplifier 200 is provided with low-pass filter 260 (low-pass filter <2>) that demodulates pulse power resulting from power amplification by drive circuit 250 to audio band analog power, and error amplifier 290 that computes and amplifies the voltage difference between the voltage of low-pass filter 280 (low-pass filter <1>) and low-pass filter 260 (low-pass filter <2>). The above sections overall form a circuit configuration having local analog feedback.

Integrating circuit block 230 generates a triangular wave that has been amplitude-modulated according to a value of the modulation width of digital pulse width modulation. At this time, a digital pulse width modulation waveform is regenerated by adding an error from the error amplifier to a signal corresponding to a value of the modulation width of digital pulse width modulation.

By means of this configuration, as a correction effect for distortion generated when a speaker is driven by pulses generated by digital pulse width modulation, it is possible to obtain distortion correction in a range of 0 to maximum in terms of digital pulse width value level—that is, 0% to 100% as duty—for all digital pulse width values in digital pulse generation. In other words, it is possible for changes to be performed in the range of a digital pulse width value from 0 to maximum for digital pulse width values of digital pulse width modulation.

By this means, the range of correction of duty of a pulse in digital pulse width modulation in a digital amplifier that performs digital pulse width modulation can be widened compared with a conventional digital amplifier, and the distortion factor of a digital amplifier can be significantly improved.

The above description presents an example of a preferred embodiment of the present invention, but the scope of the present invention is not limited to this. For example, the above embodiment is an example in which the present invention is applied to various kinds of acoustic apparatus, but the present invention can also be applied in a similar way to any kind of device that amplifies sound.

Also, in the above embodiment, the term "digital amplifier" has been used, but this is simply for convenience of description, and a term such as "power amplifier circuit" or "class D amplifier" may, of course, also be used.

Furthermore, the type, number, connection method, and so forth of circuit sections—for example, a quantizer, low-pass filter, and the like—configuring the above-described digital amplifier are not limited to those in the above embodiment.

The disclosure of Japanese Patent Application No. 2010-083295, filed on Mar. 31, 2010, including the specification, drawings and abstract, is incorporated herein by reference in its entirety.

INDUSTRIAL APPLICABILITY

A digital amplifier according to the present invention is suitable for use in an audio application supplying power to a load including a speaker or the like that inputs a digital signal and drives a speaker directly with the digital signal. The present invention is not only suitable for use in a digital amplifier in various kinds of acoustic apparatus, but can also be widely applied to a digital amplifier in electronic devices other than an acoustic apparatus.

REFERENCE SIGNS LIST 100, 200 Digital amplifier
110 1-bit quantizer
120 Level-adaptive triangular wave generation circuit
130 Drive circuit
140, 260 Low-pass filter (low-pass filter <2>)
150, 280 Low-pass filter (low-pass filter <1>)
160 Comparator
170, 270 Speaker
210 Digital modulation block
211 Digital pulse width modulation conversion circuit
212 Digital pulse width value conversion circuit
213 Level value information storage section
220 Voltage value conversion block
221, 232, 233, 241 Operational amplifier
230 Integrating circuit block
231 Frequency divider
234 Capacitor
240 Comparator
250 Drive circuit
290 Error amplifier

The invention claimed is:

1. A digital amplifier that receives a digital signal and drives a speaker directly with the digital signal, the digital amplifier comprising:
a digital modulation circuit that performs digital pulse width modulation on digital audio data;
a first analog audio output section that performs low-pass filtering of a pulse voltage that is output from the digital modulation circuit and outputs an analog audio voltage;
a triangular wave generation circuit that generates an amplitude-modulated triangular wave based on a value of a modulation width of the digital pulse width modulation;
a drive circuit that amplifies an output voltage from the triangular wave generation circuit;
a second analog audio output section that performs low-pass filtering of a signal power-amplified by the drive circuit and outputs audio band analog power; and
an error amplifier that computes and amplifies a voltage difference between a voltage of the first analog audio output section and a voltage of the second analog audio output section,
wherein the triangular wave generation circuit adds an error from the error amplifier to a signal corresponding to the value of the modulation width of the digital pulse width modulation and regenerates a digital pulse width modulation waveform.

2. The digital amplifier according to claim 1, further comprising a comparator that compares the output voltage of the triangular wave generation circuit with a voltage of a predetermined reference potential,
wherein the drive circuit amplifies power of the digital pulse width modulation based on a result of the comparison of the comparator.

3. The digital amplifier according to claim 1, wherein the triangular wave generation circuit comprises a voltage value conversion circuit that converts the signal corresponding to the value of the modulation width of the digital pulse width modulation into a voltage value.

4. The digital amplifier according to claim 1, wherein the triangular wave generation circuit comprises an integrating circuit that generates a triangular wave by means of a master clock and modulates the generated triangular wave based on the signal corresponding to the value of the modulation width of the digital pulse width modulation.

5. The digital amplifier according to claim 1, wherein:
the digital modulation circuit comprises a quantizer that quantizes the digital signal; and
the triangular wave generation circuit uses the number of levels of the quantizer in integration constant switching and generates a triangular wave corresponding to the number of levels.

* * * * *